(12) United States Patent
Du et al.

(10) Patent No.: US 12,345,595 B2
(45) Date of Patent: Jul. 1, 2025

(54) EYE SAFETY INTERLOCK FOR FIBER-COUPLED HIGH POWER LASER SOURCES

(71) Applicant: II-VI Delaware, Inc., Wilmington, DE (US)

(72) Inventors: Tengda Du, San Jose, CA (US); Xiaojie Xu, Pleasanton, CA (US); Tsurugi Sudo, Cupertino, CA (US); Martin Kwakernaak, San Jose, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 831 days.

(21) Appl. No.: 17/511,742

(22) Filed: Oct. 27, 2021

(65) Prior Publication Data
US 2023/0130007 A1    Apr. 27, 2023

(51) Int. Cl.
| | |
|---|---|
| *G01M 11/00* | (2006.01) |
| *G01J 1/42* | (2006.01) |
| *G02B 27/14* | (2006.01) |
| *H01S 5/00* | (2006.01) |
| *H01S 5/042* | (2006.01) |

(52) U.S. Cl.
CPC ......... *G01M 11/31* (2013.01); *G01J 1/4257* (2013.01); *G02B 27/144* (2013.01); *H01S 5/0014* (2013.01); *H01S 5/042* (2013.01)

(58) Field of Classification Search
CPC ..... H01S 5/042; G01M 11/31; H04B 2210/08
See application file for complete search history.

(56) References Cited

U.S. PATENT DOCUMENTS

| | | | |
|---|---|---|---|
| 4,543,477 A | * | 9/1985 | Doi ................ A61B 18/20 356/73.1 |
| 4,812,641 A | | 3/1989 | Ortiz, Jr. |
| 6,301,036 B1 | | 10/2001 | Spencer |
| 6,423,963 B1 | | 7/2002 | Wu |

(Continued)

FOREIGN PATENT DOCUMENTS

EP    2 701 248    2/2014

OTHER PUBLICATIONS

Hinton, Kerry et al., "Automatic Laser Shutdown Implications for All Optical Data Networks", Journal of Lightwave Technology, vol. 24, No. 2, Feb. 2006, pp. 674-680.

*Primary Examiner* — Michael Carter
(74) *Attorney, Agent, or Firm* — McAndrews, Held & Malloy, Ltd.

(57) ABSTRACT

A system is proposed for continuously monitoring the integrity of a transmission fiber coupled to a laser source and immediately shutting down the laser source upon recognition of any type of cut, break or disconnect along the transmission fiber. A pair of monitoring photodiodes is included with the laser source and used to look at the ratio of reflected light to transmitted light, shutting down the laser if the ratio exceeds a given threshold. If a break is present, the power of the reflected light will be higher than normal, where a defined threshold is used to determine of the calculated intensity is indicative of a break. By using measurements performed in terms of decibels, the monitoring system needs only to take the difference in intensities to generate the reflection/transmission ratio output.

10 Claims, 2 Drawing Sheets

(56) References Cited

U.S. PATENT DOCUMENTS

| | | | |
|---|---|---|---|
| 6,483,616 B1 * | 11/2002 | Maddocks | H04B 10/0771 |
| | | | 398/1 |
| 6,504,630 B1 | 1/2003 | Czarnocha et al. | |
| 6,583,899 B1 | 6/2003 | Casanova et al. | |
| 6,681,079 B1 * | 1/2004 | Maroney | H04B 10/0771 |
| | | | 398/20 |
| 7,116,471 B2 | 10/2006 | Ghera et al. | |
| 7,184,668 B2 | 2/2007 | Aronson et al. | |
| 7,445,389 B2 | 11/2008 | Aronson | |
| 8,638,428 B2 * | 1/2014 | Brown | A61B 18/22 |
| | | | 356/73.1 |
| 8,699,874 B2 | 4/2014 | Kokkinos | |
| 8,934,511 B1 | 1/2015 | Woodruff et al. | |
| 9,267,330 B2 | 2/2016 | Rinzler et al. | |
| 9,281,653 B2 | 3/2016 | Stadler et al. | |
| 9,287,991 B2 | 3/2016 | Vieth | |
| 10,135,525 B2 | 11/2018 | Huang et al. | |
| 10,291,324 B2 | 5/2019 | Aronson et al. | |
| 10,585,291 B2 | 3/2020 | Gerlitz | |
| 2003/0002109 A1 | 1/2003 | Hochberg et al. | |
| 2003/0103536 A1 | 6/2003 | Leggett et al. | |
| 2005/0286895 A1 * | 12/2005 | Lee | H04J 14/0247 |
| | | | 398/79 |
| 2008/0266570 A1 * | 10/2008 | Sezerman | G01M 11/319 |
| | | | 356/445 |
| 2014/0055777 A1 | 2/2014 | Archambault et al. | |
| 2022/0166500 A1 * | 5/2022 | Bownass | H04B 10/032 |

\* cited by examiner

EYE SAFETY INTERLOCK FOR FIBER-COUPLED HIGH POWER LASER SOURCES

TECHNICAL FIELD

The described invention relates to a system for continuously monitoring the integrity of a transmission fiber coupled to a laser source and shutting down the laser source upon recognition of any type of cut, break or disconnect along the transmission fiber.

BACKGROUND OF THE INVENTION

High-power laser sources are used in a variety of different applications, from supporting the transmission of high-speed data signals over long-haul transmission fibers to welding/cutting materials with the laser beam itself (in the case of the latter, the high-power beam is delivered to the work site via an optical fiber). While extremely useful, any inadvertent type of break or cut in the transmission fiber (or disconnect of the fiber termination from other equipment) may result in the inadvertent release of high energy beams from the exposed endface at a fiber break location (or disconnect). One particular concern is related to damage to one's eyes if a worker is exposed to a laser beam ("eye safety" is typically a defined criteria for many systems). Indeed, most countries require laser sources operating above a certain power level to include a safety interlock to shut down a laser source in the event of a fiber break or disconnect. Some prior art interlock configurations are based upon monitoring optical power at both ends of the fiber span, performing a calculation of loss and comparing the calculated loss to an expected value. When the received signal power goes below a certain level (which indicates that a fiber break or disconnect may have occurred), a "disable" control signal is sent to the laser source.

The need to monitor power at both ends of the fiber span to perform the monitoring (i.e., a "system level" monitor) may not be able to react as quickly as desirable in some situations, or may trigger a "false positive" disable laser control signal in situations where the drop in power is related to elements other than the fiber span itself.

SUMMARY OF THE INVENTION

The needs remaining in the art are addressed by the present invention, which relates to a system for continuously monitoring the integrity of a transmission fiber coupled to a laser source and immediately shutting down the laser source upon recognition of any type of cut, break or disconnect along the transmission fiber.

In an exemplary arrangement of the present invention, a pair of monitoring photodiodes is included with the laser source and used to look at the ratio of reflected light to transmitted light, shutting down the laser if the ratio exceeds a given threshold. If a break is present, the power of the reflected light will be higher than normal, where a defined threshold is used to determine of the calculated intensity is indicative of a break. By using measurements performed in terms of decibels, the monitoring system needs only to take the difference in intensities to generate the reflection/transmission ratio output.

In one embodiment, the present invention takes the form of a laser shutdown safety system including a beam splitting device and a pair of monitoring photodiodes. The beam splitting device is positioned along an optical signal path at an output from a laser source, and is used for directing a first, small portion of the optical output beam away from the optical signal path and passing a second, large portion of the optical beam along the optical signal path and into an associated optical transmission fiber. A first monitoring photodiode of the pair is disposed to receive the first, small portion of the optical beam redirected by the beam splitting device and generate therefrom a reference photocurrent based upon a transmitted power of the optical beam, and a second monitoring photodiode of the pair is disposed to receiving any reflected beam incoming from the associated optical transmission fiber, where a back-reflected beam is indicative of a loss of continuity along the associated optical transmission fiber, the second monitoring photodiode generating a photocurrent of a level commensurate with the power level of the back-reflected beam. The safety system also includes a control module responsive to the photocurrent outputs from the first and second monitoring photodiodes, for generating therefrom a control signal for shutting down the laser source based on the photocurrent values.

A method of utilizing the inventive system to monitor an optical transmission fiber may include the steps of: determining a back-reflection power threshold $Y_{th}$ associated with the on-set of harmful radiation; measuring in a first monitoring photodiode at the laser transmitter source, an out-coupled portion of an output beam generated by the laser; measuring in a second monitoring photodiode at the laser transmitter source, a back-reflected beam returning to the laser transmitter source along the optical transmission fiber; comparing the power in the back-reflected beam to the power in the out-coupled portion of the transmitted beam to generate a ratio R; and transmitting a "turn off" signal to the laser diode within the laser transmitter source when $R > Y_{th}$.

Various other advantages and embodiments of the present invention will become apparent during the course of the following discussion and by reference to the accompanying drawings.

DETAILED DESCRIPTION

The capacity of optical communications networks continues to grow, with one aspect of that growth the utilization of optical amplifiers to increase the power level that may be achieved between links in the network. For example, optical amplifiers used in long-haul telecommunications can launch 200-400 mW of optical power into systems based on the use of single mode fibers; next-generation systems are expected to reach levels approaching 1 W. Even in the local deployment of "passive" optical networks, the optical power required for analog video transport "to the home" is on the order of 200 mW. At these power levels, radiation safety issues become significant. Accidental cable or fiber breaks, as well as uncoupled or "open" connectors may expose the human body to invisible infra-red radiation and cause damage, depending on exposure time.

Figure 1:
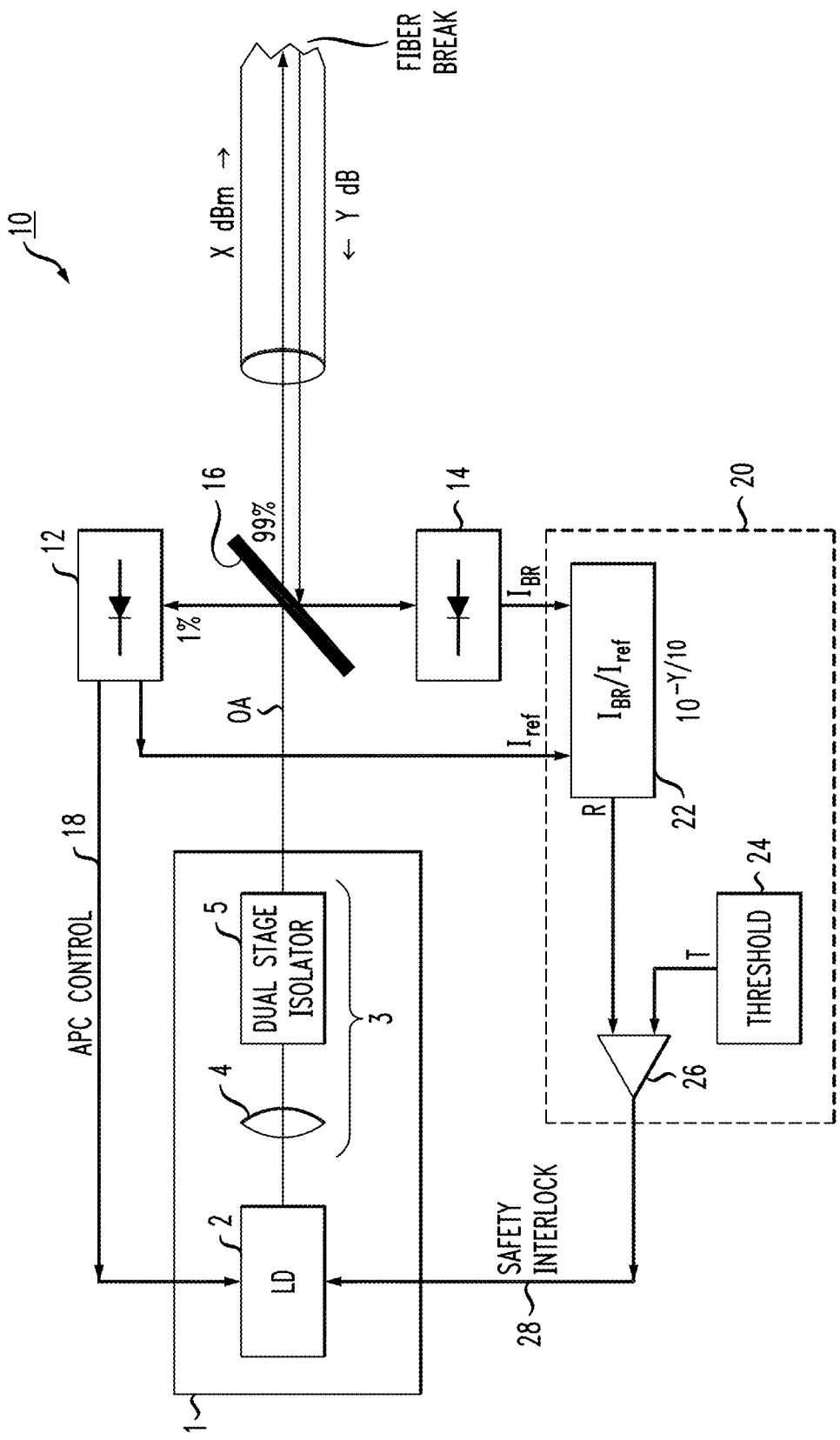
FIG. 1 is a block diagram of any exemplary laser safety shutdown system formed in accordance with the principles of the present invention.

FIG. 1 illustrates an exemplary laser turn-off safety system 10, formed in accordance with the principles of the present invention to recognize these "fiber break" or "open connector" situations and instruct the laser source to turn off.

System 10 is shown as being used with a conventional laser source 1, which includes a laser diode 2 and beam shaping optics 3. Here, the beam-shaping optics includes a collimating lens 4 and a dual-stage isolator 5. The components of laser source 1 are considered as merely representative of the state of the art. Safety system 10 is adaptable for use with any conventional arrangement of optical sources.

Safety system 10 is based upon the use of a pair of monitoring photodiodes 12, 14 in combination with a beam splitting element to continuously measure the output power from laser source 1 and back-reflected light (if any) from a fiber break/disconnect (generally referred to as a "loss of continuity" along the optical fiber). Referring to the embodiment as illustrated in FIG. 1, the beam splitting element takes the form of a partially reflective mirror 16 that is positioned along the optical output axis (OA) from laser source 1. Upon reaching mirror 16, a small percentage of the generated beam (shown here to be about 1%) is directed into first monitoring photodiode 12. The remainder of the beam (here, 99%) is allowed to continue to propagate along the optical signal output path and ultimately coupled into a transmission fiber F. The power in this output beam is defined as X dBm for the purposes of understanding the principles of the present invention.

Similar to various prior art "lockout" systems, if the absolute power of the reflected 1% measured by first monitoring photodiode 12 exceeds a given threshold, it may be presumed that laser source 1 is generating an extremely excessive amount of power and may fail at any moment. A first control signal path 18 is shown as coupled between first monitoring photodiode 12 and laser diode 2, where in the event of a "run away" laser, an "automatic power control" (APC) signal is sent along path 18 and used to turn off laser diode 2.

Second monitoring photodiode 14 is positioned as shown in FIG. 1 to capture back reflections along transmission fiber F (the reflections denoted as Y dB in the illustration). In particular, second monitoring photodiode 14 is positioned within respect to partially reflective mirror 16 so that any back reflections are re-directed by a reflective surface 16R of partially reflective mirror 16 into second monitoring photodiode 14. The received back-reflected light is then converted by second monitoring photodiode 14 in a photocurrent $I_{BR}$.

In accordance with the principles of the present invention, any kind of loss of continuity (e.g., fiber break/disconnect) along transmission fiber F may be identified by using second monitoring photodiode 14 in combination with first monitoring photodiode 12 to determine if a particular level of back-reflected light is higher than anticipated (as a function of the original output power X dBm) and is thus indicative of a problem. For explanatory purposes, the back reflection is defined as having a level defined as "Y dB". A high level of back-reflected light may be the result of a fiber break, a complete cable cut, an open connector, etc., creating the possibility for an individual's eyes to be exposed to a high power output beam. Any of these interruptions in the optical signal path result in the transmitted beam being reflected back towards laser source 1. As described above, these back reflections first encounter reflective surface 16R of mirror 16 and are directed into second monitoring photodiode 14.

First monitoring photodiode 12 is shown as providing a photocurrent output $I_{ref}$ that is applied as a first input to a safety control module 20, where photocurrent $I_{ref}$ is indicative of the output power from laser source 1. Presuming that the output beam from laser source 1 maintains an essentially constant output power, a constant fraction of that power will be directed into first monitoring photodiode 12 and thus generate a constant output photocurrent $I_{ref}$. For example, presuming a 1:99 split ratio and a 30 dBm output power from source 1, a 5 dBm beam will be directed into first monitoring photodiode 12. This power level results in a generated photocurrent of about 1300 μA. Thus, in terms of performing safety monitoring, the output from first monitoring diode 12 that is applied as an input to control module 20 remains a constant indicator (i.e. "reference") of the transmitted power level. By virtue of using a constant ratio power splitter, if the laser beam power generated by source 1 does fluctuate or change in value, the photocurrent generated by first monitoring photodiode 12 will track this change, ensuring that reference photocurrent $I_{ref}$ will consistently represent the generated laser power.

Second monitoring photodiode 14 is shown as generating a photocurrent output $I_{BR}$ that is indicative of the level of the back-reflected light. Photocurrent $I_{BR}$ is also applied as an input to safety control module 20. In particular, the two photocurrents $I_{ref}$, $I_{BR}$ are applied as inputs to a ratio generator 22, which in this case is used to generate a ratio R of back-reflected current $I_{BR}$ to reference current $I_{ref}$. If this ratio exceeds a given threshold, it is presumed that there exists a fiber break/disconnect and the reflected beam may be strong enough to cause radiation damage. A defined threshold $Y_{th}$ is shown in this particular embodiment as held within a memory element 24 within control module 20. The defined threshold $Y_{th}$ and measured ratio R are applied as inputs to a comparator 26, where if R>$Y_{th}$, a "shut down" signal is generated by control module 20 and passed along signal path 28 to laser diode 2 within laser diode 1.

Table I, shown below, is useful in understanding various operational scenarios associated with safety system 10.

TABLE I

| I<br>X<br>(dBm) | II<br>Y<br>(dB) | III<br>Split<br>Ratio<br>(dB) | IV<br>Power into<br>PD 12<br>(dBm);<br>photocurrent<br>out $I_{ref}$<br>(μA) | V<br>Power into<br>PD 14<br>(dBm);<br>Photocurrent<br>out $I_{BR}$<br>(μA) | VI<br>Photocurrent<br>Ratio $I_{BR}/I_{ref}$<br>(defined as R)<br>from generator 22 |
|---|---|---|---|---|---|
| 25 | −14 | −20 | 5; 3162.3 | −9; 125.9 | 0.040 |
| 25 | −20 | −20 | 5; 3162.3 | −15; 31.6 | 0.010 |
| 25 | −25 | −20 | 5; 3162.3 | −20; 10.0 | 0.003 |
| 25 | −30 | −20 | 5; 3162.3 | −25; 3.2 | 0.001 |

Column I contains the value of a transmitted optical power level, shown as "X dBm" in FIG. 1 as the power in the beam that passes through partially reflective mirror 16. For the purposes of understanding the operation of safety system 10 as monitoring reflections caused by a fiber break or disconnect, the value of X is held constant 25 dBm for all of the examples shown in Table I. A set of four different levels of back reflection "Y" (defined in dB) is shown in Column II, here having values ranging from −14 dB to −30 dB. It is known that the lower the dB value, the smaller the level of reflection. These values are exemplary of different conditions along the transmission fiber.

Thus, for the scenario where Y is −14 dB, this is considered as a relatively large level of reflection and is likely to be associated with a fiber break/disconnect and may expose system technicians to high power laser radiation (resulting in eye damage in some cases). Conversely, for the scenario where Y is −30 dB, the back reflection is relatively low (and may be associated with problems other than a fiber break/disconnect). As will be discussed below, a threshold $Y_{th}$ is established for a particular safety system that identifies a specific value for "Y" that requires the shutdown of laser diode 2.

The "split ratio" included in Column III of the table is the value defining the reflect/transmit split ratio of partially reflective mirror 16. For the 1%/99% configuration of FIG. 1, the split ratio is −20 dB. For this 1/99 split and a value for X held at 25 dBm, the beam captured by monitoring photodiode 12 has a power that is fixed at 5 dBm, as shown in Column IV of the table. Also shown in Column IV is the reference photocurrent $I_{ref}$ generated from this power level, here $I_{ref}$=1362.3 µA.

The power in any back reflections, as measured by second monitoring photodiode 14, is shown in Column V of Table I. The back-reflected photocurrent (measured in µA and defined $I_{BR}$) is also shown in Column V. As discussed above in association with the description of safety system 10 of FIG. 1, ratio generator 22 is used to calculate the ratio of $I_{BR}/I_{ref}$, with this ratio then used as the indicator of safety system 10 and used to control the shutdown of laser diode 2 within laser source 1, as necessary.

By virtue of using the pair of photodiodes, the ratio is defined as $10^{-Y/10}$ and is thereafter only dependent on the value of "Y", the reflection associated with a break/disconnect. Referring back to FIG. 1, this current ratio provided by ratio generator 22 is then compared against a threshold $Y_{th}$ to determine when to shut down laser diode 2. For example, if the threshold $Y_{th}$ is defined as −17 dB, then the first two rows of entries in Table I (shown in bold) would indicate an excess of back-reflected power that is likely associated with a fiber break/disconnect. When the threshold is exceeded, control system 20 sends a "shut down" control signal to laser diode 2.

An advantage of the system of the present invention is that the overall communications network/transmission system does not need to be used to monitor and control the safety conditions associated with the laser source. Safety system 10 performs that monitoring by itself, without the need to "poll" other nodes along the optical path for signal strength measurements.

Figure 2:
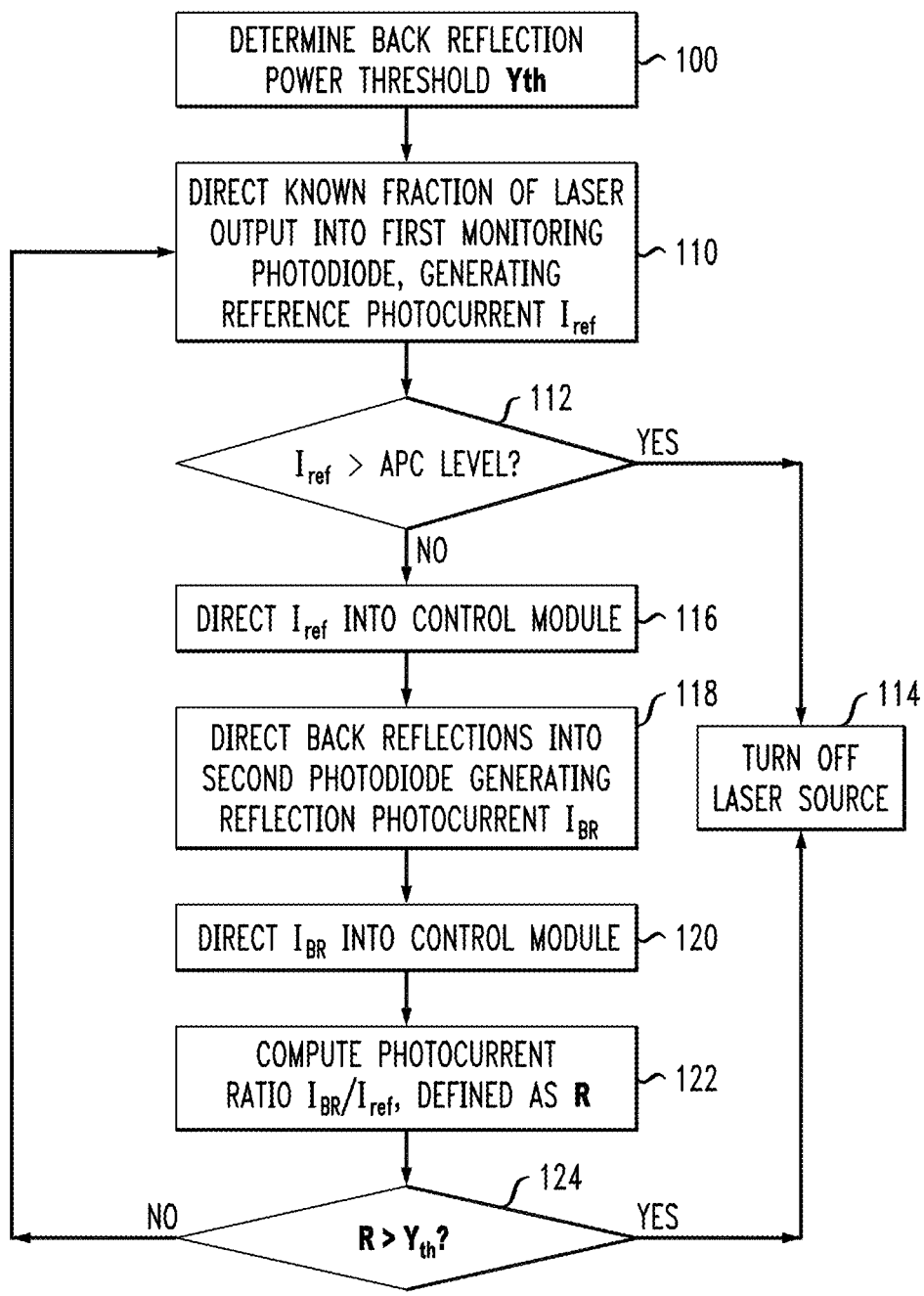
FIG. 2 is a flowchart illustrating an exemplary process of using the safety shutdown system of the present invention.

FIG. 2 is a flow chart of an exemplary process that may be implemented by safety system 10 to perform continuous monitoring of a transmission fiber and generate a "shut down" control signal upon recognition of a fiber break/disconnect. The process begins, as shown in step 100, with a determination of a proper threshold value $Y_{th}$ of the back reflection Y. As discussed above, the threshold is defined by the optical system operator and is selected to ensure that laser source will be deactivated upon sensing a back reflection level indicative of any kind of break or disconnect along the transmission fiber. This threshold level $Y_{th}$ is continuously used during the monitoring process to minimize the chance for anyone to be harmed by a high power laser beam exiting at the fiber break.

Continuing with a description of the monitoring process, a known portion (fraction) of the output beam from the laser source is directed into a first monitoring photodiode in step 110. The power present in this portion of the laser beam is relatively small, for example on the level of about 1%, and tracks any changes in the output power from the laser source. Step 110 further describes the monitoring process of generating the output photocurrent from this optical input, where the value of the photocurrent will similarly track changes in the power level of the beam generated by the laser source. For monitoring purposes, this photocurrent is denoted as the "reference photocurrent $I_{ref}$".

In most cases, the monitoring system of the present invention is configured to not only recognize fiber breaks/disconnects, but also problems with the laser diode, particularly with respect to generating unwanted high levels of laser power. Step 112 in the monitoring process compares the value of $I_{ref}$ to an "automated power control" (APC), where if $I_{ref}$ is greater than APC the monitoring process moves to step 114, which sends a control signal to turn off the laser source.

As long as $I_{ref}$ remains less than APC, the monitoring process moves onto step 116, which applies $I_{ref}$ as a first input to the control module of the safety system. Step 118 is associated with capturing back reflections Y within a second photodiode and forming the "back reflected" photocurrent $I_{BR}$. Photocurrent $I_{BR}$ is shown as applied as an input to the control module in step 120, with step 122 calculating the ratio of $I_{BR}$ to $I_{ref}$. This ratio R is compared to the back reflection threshold $Y_{th}$ in step 124. If R is greater than $Y_{th}$, this means that the back reflection power is too high, and the laser source needs to be shut down. This is indicated in the flow chart by directing the "yes" output of comparison step 124 to turn-off control step 114. Otherwise, as long as the ratio R remains less than back-reflection threshold $Y_{th}$, the continuous monitoring process loops back to step 110 to continue assessing the level of the back reflections along the output fiber.

It is appreciated by persons skilled in the art that the present invention is not limited by what has been particularly shown and described hereinabove. Rather, the scope of the present invention includes both combinations and subcombinations of various features described hereinabove, as well as variations thereof and modifications thereto that would occur to a person of skill in the art upon reading the above description and which are not in the prior art.

What is claimed is:

1. A laser shutdown safety system, comprising:
a beam splitting device positioned along an optical signal path at an output from a laser source, for intercepting an optical beam output from the laser source and directing a first, small portion of the optical output beam away from the optical signal path and passing a second, large portion of the optical beam along the optical signal path and into an associated optical transmission fiber;
a first monitoring photodiode disposed to receive the first, small portion of the optical beam redirected by the beam splitting device and generate therefrom a reference photocurrent based upon a transmitted power of the optical beam;
a second monitoring photodiode disposed with respect to the beam splitting device so as to receive a reflected beam exiting the associated optical transmission fiber and impinging the beam splitting device, where a reflected beam is indicative of a loss of continuity along the associated optical transmission fiber, the second monitoring photodiode generating a photocurrent of a level commensurate with a power level of the reflected beam; and
a control module responsive to the photocurrent outputs from the first and second monitoring photodiodes and generating therefrom a control signal for shutting down the laser source based on the photocurrent values; and
an automatic power control signal path between the output of the first monitoring photodiode and the laser source, for transmitting a lockout signal to the laser source when the photocurrent output from the first monitoring photodiode exceeds a defined excessive power value.

2. The laser safety shutdown system as defined in claim 1 wherein the control module includes a ratio generator for calculating a ratio R of the second monitoring photodiode output to the first monitoring photodiode output, the control module generating the control signal for shutting down the laser source when the ratio R exceeds a predetermined value.

3. The laser safety shutdown system as defined in claim 2 wherein the control module further comprises
   a memory element for storing a determined threshold value $Y_{th}$; and
   a comparator responsive to the ratio generator and memory element, providing the control signal for shutting down the laser source when $R > Y_{th}$.

4. The laser safety shutdown system as defined in claim 3 wherein the determined threshold is a fixed value stored in the memory element.

5. The laser safety shutdown system as defined in claim 3 wherein the determined threshold value stored in the memory element may be updated, as necessary.

6. The laser safety shutdown system as defined in claim 1 where the beam splitting element comprises a partially reflective mirror.

7. The laser safety shutdown system as defined in claim 6 wherein the partially reflective mirror is configured to redirect no more than 10% of the output beam energy into the first monitoring photodiode.

8. The laser safety shutdown system as defined in claim 6 wherein the partially reflective mirror is configured to redirect no more than 1% of the output beam energy into the first monitoring photodiode.

9. The laser safety shutdown system as defined in claim 1 wherein the loss of continuity is associated with a break in the optical transmission fiber.

10. The laser safety shutdown system as defined in claim 1 wherein the loss of continuity is associated with a disconnect between the optical transmission fiber and a connector element.

* * * * *